United States Patent
Hong

(10) Patent No.: US 6,180,522 B1
(45) Date of Patent: Jan. 30, 2001

(54) METHOD OF FORMING A CONTACT IN A SEMICONDUCTOR DEVICE

(75) Inventor: Jeong-Eui Hong, Chungcheongbuk-do (KR)

(73) Assignee: Hyundai Electronics Industries Co., Ltd., Ichon-shi (KR)

( * ) Notice: Under 35 U.S.C. 154(b), the term of this patent shall be extended for 0 days.

(21) Appl. No.: 09/317,953

(22) Filed: May 25, 1999

(30) Foreign Application Priority Data

Jan. 29, 1999 (KR) .................................................. 99-2878

(51) Int. Cl.$^7$ .................................................. H01L 21/28
(52) U.S. Cl. .......................... 438/659; 438/653; 438/655; 438/656
(58) Field of Search .................................... 438/653, 655, 438/656, 659, FOR 350, FOR 352, FOR 360

(56) References Cited

U.S. PATENT DOCUMENTS

| | | | |
|---|---|---|---|
| 5,385,859 | 1/1995 | Enomoto | 437/52 |
| 5,963,839 | * 10/1999 | Huang . | |

* cited by examiner

Primary Examiner—George Fourson
Assistant Examiner—Joannie A. Garcia
(74) Attorney, Agent, or Firm—Fleshner & Kim, LLP

(57) ABSTRACT

The present invention relates to a method of forming a contact in semiconductor device, more particularly, to a method of forming a tungsten bitline contact in a semiconductor device which prevents the decrease of impurity ion density in an impurity region and reduces both contact resistance between a plug and the impurity region and leakage current in a junction by forming an extra barrier layer in a metal barrier layer having been deposited on the impurity region, thereby improving operation speed of a semiconductor device and lessening power consumption. The a present invention includes the steps of forming an insulating layer on a semiconductor substrate wherein an impurity diffusion region is formed on a predetermined portion of the substrate, forming a contact hole exposing a portion of the impurity diffusion region by removing a predetermined portion of the insulating layer, forming a first conductive layer on the first insulating layer and in the contact hole, forming a second conductive layer on the first conductive layer, forming a third conductive layer at an interface between the first conductive layer and the impurity diffusion region, forming a buried layer for preventing ion-diffusion inside the second conductive layer, forming a conductive plug filling up the contact hole on a predetermined portion of the second conductive layer, and forming a fourth conductive layer on the second conductive layer wherein the fourth conductive layer is electrically connected to an upper surface of the plug.

21 Claims, 4 Drawing Sheets

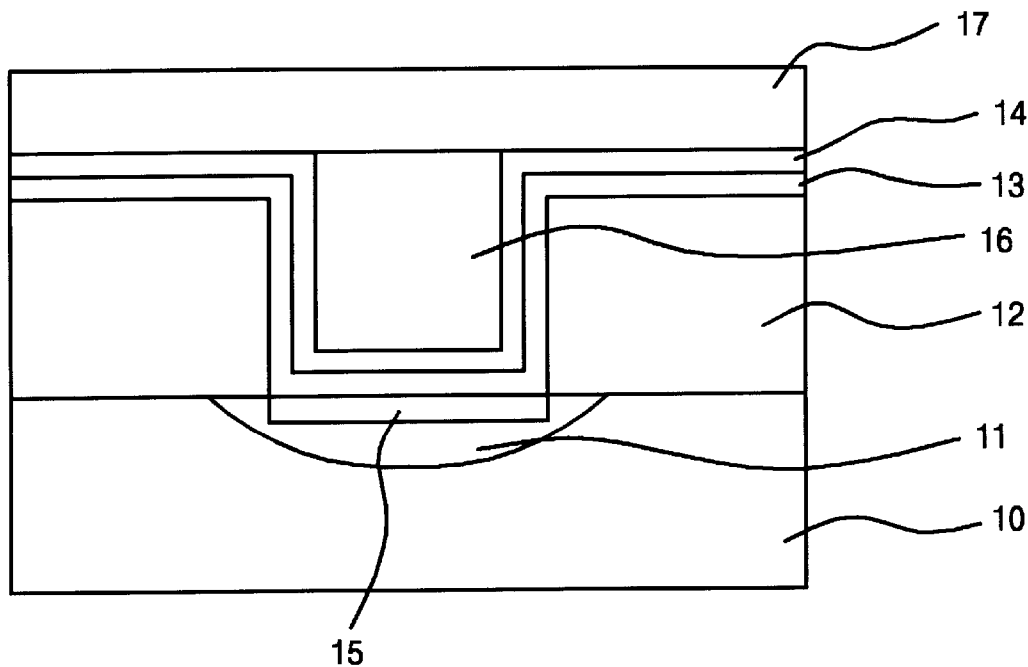

METHOD OF FORMING A CONTACT IN A SEMICONDUCTOR DEVICE

BACKGROUND OF THE INVENTION

1. Field of Invention

The present invention relates to a method of forming a contact in semiconductor device, more particularly, to a method of forming a tungsten bitline contact in a semiconductor device which prevents the decrease of impurity ion density in an impurity region and reduces both contact resistance between a plug and the impurity region and leakage current in a junction by forming an extra barrier layer in a metal barrier layer having been deposited on the impurity region, thereby improving operation speed of a semiconductor device and lessening power consumption.

2. Discussion of Related Art

It is very important to design a circuit of low power consumption and high operation speed as the density of semiconductor becomes higher rapidly. One of limitations required for designing such a circuit of low power consumption is the reduced contact resistance.

A major study for increasing the integration and operating speed in a memory device is the technique of forming plug and bitline with tungsten. This technique is essential to the fabrication of a high performance memory device as specific electric resistance of this structure is one-eighth less than that of the tungsten-polycrystalline silicon.

In the contact area of a tungsten bitline according to a related art, the impurity region of source and drain is doped with B, the metal barrier layer is made of TiN and the plug is formed with tungsten(W).

B tends to diffuse into metal, i.e. TiN and W, at a high temperature over 700° C. After a bitline has been formed with W, impurity ions having been buried in source/drain regions diffuse into the TiN and W layers during the following steps for capacitor fabrication, insulating interlayer deposition, thermal treatment and the like, wherein W has the highest tendency in diffusion.

Then, the density of B of a dopant in the impurity diffusion region of a substrate decreases, while the contact resistance increases. Thus, power consumption of a device increases and operation speed becomes slow.

A plug of W is formed by flowing gases such as $WF_6$ on a barrier metal layer preventing diffusion by chemical vapor deposition(hereinafter abbreviated CVD) to fill up a contact hole.

Having been contained in the plug, F out of $WF_6$ diffuses into an interface between Si and $TiSi_x$ at a surface of the silicon substrate to form $TiF_x$ and penetrates into the source/drain junction deep. Thus, contact resistance and junction leakage current increase.

When heat treatment to form $TiSi_x$ of silicide is carried out on a substrate, the volume of TiN which is a barrier metal layer at the lower part of a contact hole is larger than that of $TiSi_x$ which is silicide. Thus, micro-cracks are brought about by the stress caused by the reduced volume when $TiSi_x$ is formed.

Figure 1A:
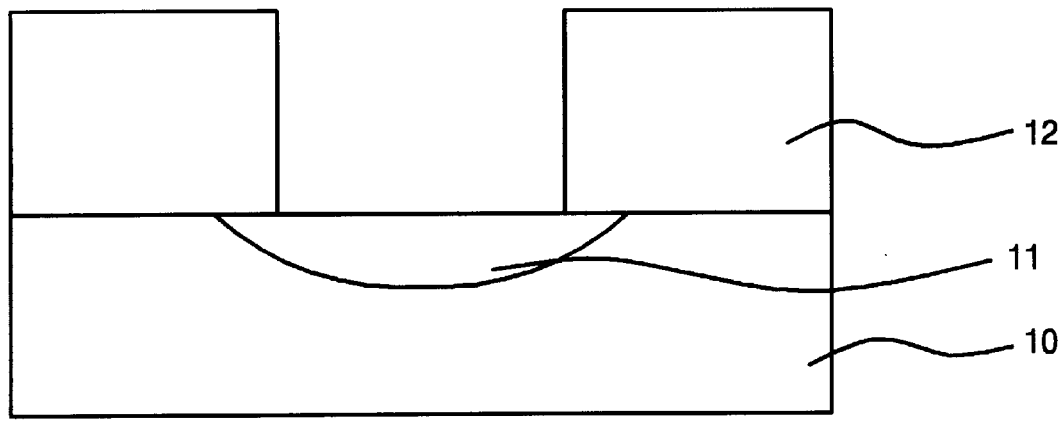
Figure 1B:
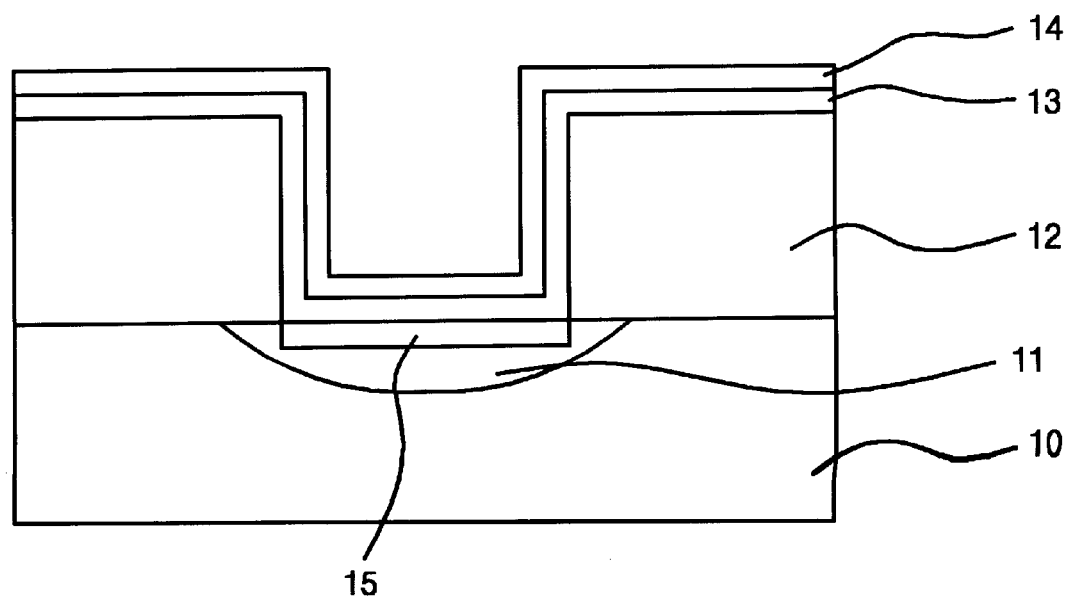

FIGS. 1A to FIGS. 1C show cross-sectional views of forming a contact in a semiconductor device according to a related art.

Referring to FIGS. 1A, an insulating interlayer 12 is formed by depositing an oxide or nitride layer on a semiconductor substrate 10, in which a p-typed impurity diffusion region 11 having been heavily doped with B to form source and drain, by CVD.

The insulating interlayer 12 is coated with photoresist. Then, a photresist pattern exposing the portion of the insulating interlayer 12 over the contact area to be opened is formed by exposure and development of the photoresist.

A contact hole exposing a portion of the impurity diffusion region 11 is formed by removing the portion of the insulating interlayer which is not covered with the photoresist pattern. In this case, a bitline contact including a plug is to be formed in the contact hole.

A natural oxide layer on the impurity diffusion region 11 of the substrate which is exposed by the formation of the contact hole and polymers having remained in the contact hole are removed by a cleaning process with HF or BOE.

Referring to FIGS. 1B, a Ti layer 13 is formed on the remaining insulating interlayer 12 and the exposed impurity diffusion region 11 to form a silicide layer. And, a TiN layer 14 as a barrier metal layer 14 which prevents diffusion is deposited on the Ti layer 13. In this case, each of the metal layers 13 and 14 is formed by sputtering to be about 300 Å thick. The sputtering method uses one of Collimated Ionized Metal Plasma or Hollow Cathode Magnetron according to the aspect ratio of the contact hole.

A silicide layer 15 of $TiSi_x$, which is generated from the reaction between Ti and Si and reduces contact resistance, is formed at an interface between the Ti layer 13 and the impurity diffusion region 11 by carrying out thermal treatment on the surface of the substrate 10 at a temperature over 650° C. under nitrogen ambience. In this case, the thermal treatment is carried out by a rapid thermal process for about 30 seconds or put in the furnace for about 30 minutes.

Referring to FIGS. 1C, a tungsten layer about 4000 Å thick is formed by CVD on the barrier metal layer 14 to fill up the contact hole.

Then, a tungsten plug 16 filling up the contact hole is formed by planarizing the tungsten layer by etchback or chemical-mechanical polishing(hereinafter abbreviated CMP) until the surface of the barrier metal layer 14 is exposed.

Another tungsten layer about 1000 Å thick is deposited on the barrier metal layer 14 including a surface of the exposed plug 16 by CVD or sputtering.

A bitline 17 is defined by patterning the tungsten layer on the barrier metal layer 14 by photolithography.

Unfortunately, relating to the method of forming a bitline contact in a semiconductor device according to the related art, the density of B of a dopant in the impurity diffusion region of a substrate decreases, while the contact resistance increases. Thus, power consumption of a device increases and operation speed becomes slow.

And, having been contained in the plug, F out of $WF_6$ diffuses into an interface between Si and $TiSi_x$ at a surface of the silicon substrate to form $TiF_x$ and penetrates into the source/drain junction deep. Thus, contact resistance and junction leakage current increase.

Moreover, when heat treatment to form $TiSi_x$ of silicide is carried out on a substrate, the volume of TiN which is a barrier metal layer at the lower part of a contact hole is larger than that of $TiSi_x$ which is silicide. Thus, micro-cracks are brought about by the stress caused by the reduced volume when $TiSi_x$ is formed.

SUMMARY OF THE INVENTION

Accordingly, the present invention is directed to a method of forming a contact in semiconductor device that substantially obviates one or more of the problems due to limitations and disadvantages of the related art.

The object of the present invention is to provide a method of forming a contact in semiconductor device which prevents the decrease of impurity ion density in an impurity region and reduces both contact resistance between a plug and the impurity region and leakage current in a junction by forming an extra barrier layer in a metal barrier layer having been deposited on the impurity region, thereby improving operation speed of a semiconductor device and lessening power consumption. Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes the steps of forming an insulating layer on a semiconductor substrate wherein an impurity diffusion region is formed on a predetermined portion of the substrate, forming a contact hole exposing a portion of the impurity diffusion region by removing a predetermined portion of the insulating layer, forming a first conductive layer on the first insulating layer and in the contact hole, forming a second conductive layer on the first conductive layer, forming a third conductive layer at an interface between the first conductive layer and the impurity diffusion region, forming a buried layer for preventing ion-diffusion inside the second conductive layer, forming a conductive plug filling up the contact hole on a predetermined portion of the second conductive layer, and forming a fourth conductive layer on the second conductive layer wherein the fourth conductive layer is electrically connected to an upper surface of the plug.

In another aspect, the present invention includes the steps of forming an insulating layer on a semiconductor substrate wherein an impurity diffusion region is formed on a predetermined portion of the substrate, forming a contact hole exposing a portion of the impurity diffusion region by removing a predetermined portion of the insulating layer, forming a first conductive layer on the first insulating layer and an exposed surface of the contact hole, forming a second conductive layer covering the first conductive layer and a third conductive layer at an interface between the first conductive layer and the impurity diffusion region simultaneously, forming a buried layer for preventing ion-diffusion inside the second conductive layer, forming a conductive plug filling up the contact hole, and forming a fourth conductive layer on the second conductive layer wherein the fourth conductive layer is electrically connected to an upper surface of the plug.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the invention and together with the description serve to explain the principle of the invention.

In the drawings:

FIGS. 1A to FIGS. 1C show cross-sectional views of forming a contact in a semiconductor device according to a related art; and FIGS. 2A to FIGS. 2D show cross-sectional views of forming a contact in a semiconductor device according to the present invention.

DETAILED DESCRIPTION OF PREFERRED EMBODIMENTS

Reference will now be made in detail to the preferred embodiment of the present invention, an example of which is illustrated in the accompanying drawings.

The present invention improves the problems of the related art by forming a Ti layer and a TiN layer successively, by forming a silicide layer and by burying nitrogen at a predetermined portion of the TiN layer by ion-implantation.

The effects of nitrogen ion-implantation for forming an extra TiN layer are explained in the following description.

First, Rp(range of projection) is set to a barrier metal layer at the bottom of a contact hole by optimizing ion-implantation energy. Then, B in an impurity diffusion region in a silicon substrate is unable to be diffused into a TiN layer of the barrier metal layer and a tungsten layer of a plug during a thermal process. Thus, the contact resistance is decreased. In this case, Rp means the distance from a surface of the substrate to a region where the implanted atoms are heavily concentrated and optimal contact resistance is under 2000 Ω.

Second, as mentioned in the foregoing description, when heat treatment to form $TiSi_x$ of silicide is carried out on a substrate, the volume of TiN which is a barrier metal layer at the lower part of a contact hole is larger than that of $TiSi_x$ which is silicide. Thus, micro-cracks are brought about by the stress caused by the reduced volume when $TiSi_x$ is formed.

When a W layer to form a plug is deposited on the TiN layer having the micro-cracks by CVD, some of the source gas of $WF_6$ can't help penetrating into the impurity diffusion region in the silicon substrate. Specifically, the contact area is damaged electrically and structurally by the rapid diffusion of F in $WF_6$ through the micro-cracks of the TiN layer during a thermal process. However, the TiN layer, in which the nitrogen buried layer has been formed by ion-implantation, inhibits more or less the diffusion of F atoms owing to a stuffing effect.

Moreover, the molecules of Si—N and B—N which have been formed by subsequent thermal processes contribute to the inhibition of diffusion of impurities such as B and F into the substrate. Provided that the impurities and the tungsten are diffused into the impurity diffusion region, the source and drain junctions are fatally damaged according to the increasing density of a DRAM device of which junction depth becomes shallow.

In addition, optimal leakage at the junction is under $1E(-)15$ A/cm$^2$ at 85° C. Contact resistance according to the density of impurity ion B in the impurity diffusion region doped with p-type impurity is in the following formula:

$Rc = A \exp(N_{d\_}1/2)$, wherein Rc is contact resistance, 'A' is a constant and Nd is the density of B in a silicon substrate.

Accordingly, contact resistance increases as the density of B decreases.

FIGS. 2A to FIGS. 2D show cross-sectional views of forming a contact in a semiconductor device according to the present invention.

Figure 2A:
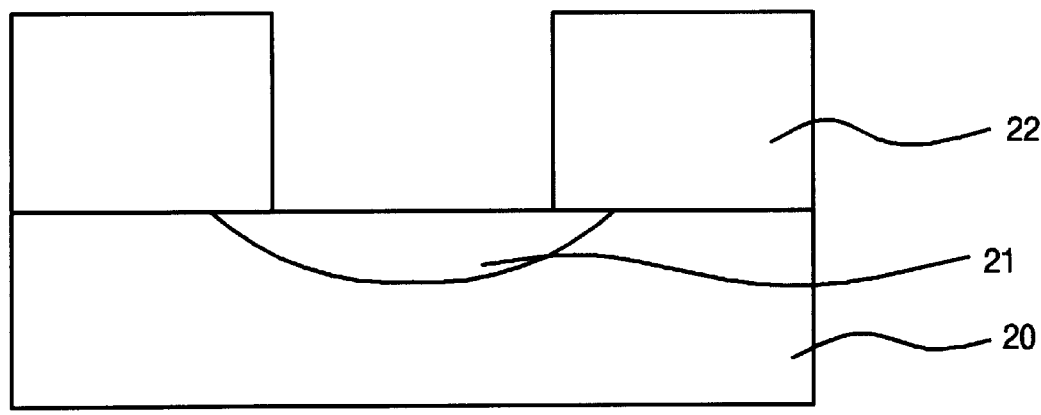

Referring to FIGS. 2A, a p-type impurity diffusion region 21 is formed by doping a predetermined portion of a semiconductor substrate 20 of semiconductor heavily with B by ion-implantation to form source and drain.

An insulating interlayer 22 is formed by depositing an oxide or nitride layer on a semiconductor substrate 20 where the impurity diffusion region has been formed, The insulating interlayer 22 is coated with photoresist. Then, a photoresist pattern exposing the portion of the insulating interlayer 22 over the contact area to be opened is formed by exposure and development of the photoresist.

A contact hole exposing a portion of the impurity diffusion region 21 is formed by removing the portion of the insulating interlayer which is not covered with the photoresist pattern. In this case, a bitline contact including a plug is to be formed in the contact hole.

And, a natural oxide layer on the impurity diffusion region 21 of the substrate 20 which is exposed by the formation of the contact hole and polymers having remained in the contact hole are removed by a cleaning process with HF or BOE.

Figure 2B:
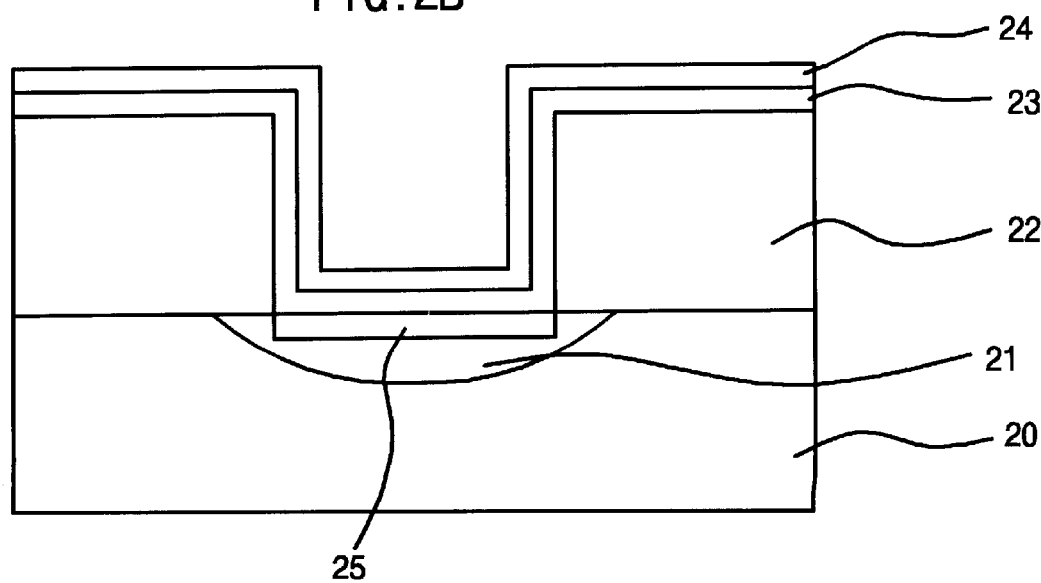

Referring to FIGS. 2B, a Ti layer 23 about 100 Å thick is formed on the remaining insulating interlayer 22 and the exposed impurity diffusion region 21 to form a silicide layer. And, a TiN layer 24 as a barrier metal layer 24, 400 Å thick, which prevents diffusion is deposited on the Ti layer 23. In this case, each of the metal layers 13 and 14 is formed by sputtering. The sputtering method uses one of Collimated Ionized Metal Plasma or Hollow Cathode Magnetron according to the aspect ratio of the contact hole.

The barrier metal layer 24 may be formed by CVD using $TiCl_4$ and $NH_3$ as source gases at a process temperature over 600° C.

A silicide layer 25 of $TiSi_x$, which is generated from the reaction between Ti and Si and reduces contact resistance, is formed at an interface between the Ti layer 23 and the impurity diffusion region 21 by carrying out thermal treatment on the surface of the substrate 20 at a temperature over 650° C. under nitrogen ambience. In this case, the thermal treatment is carried out by a rapid thermal process for about 10 to 60 seconds at 650 to 820° C. or put in the furnace for about 10 to 60 minutes at 650 to 820° C.

The thermal treatment may be skipped to simplify the process as silicide of TiSix is formed as soon as the TiN layer 24 is formed at a high temperature over 600° C. In this case, the barrier metal layer 24 of TiN is formed by CVD using $TiCl_4$ and $NH_3$ as source gases.

Figure 2C:
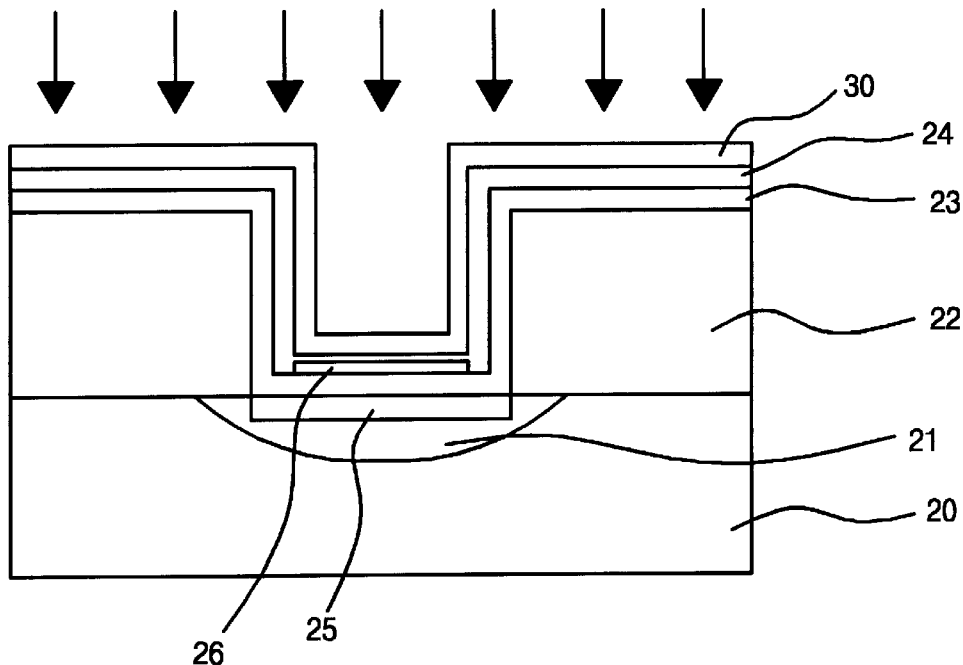

Referring to FIGS. 2C, a buried layer 26 is formed in the barrier metal layer 24 of TiN by implanting nitrogen ions on the substrate. In this case, the ion-implantation is carried out by an energy of 10 KeV and a dose of 1E15 atoms/cm² of which ranges are 10–30 KeV and 1E15–3E15 atoms/cm². The buried layer 26 implanted with nitrogen ions brings about the stuffing effect to the barrier metal layer 24. Thus, the buried layer 26 prevents boron ions in the impurity diffusion region 21 from being diffused into a plug as well as the fluorine atoms from being diffused into the impurity diffusion region 21.

After the step of forming the buried layer 26, an additional step of forming another TiN layer 30 on the TiN layer 24 may be carried out to compensate the reduced function of preventing diffusion due to the damaged barrier metal layer 24 of TiN.

The new TiN layer about 250 Å thick is formed by sputtering. Besides, the new TiN layer about 200 Å thick is formed by using organometallic sources such as TDMAT or TDEAT. In this case, the thickness of the new TiN layer ranges 100 to 300 Å.

Figure 2D:
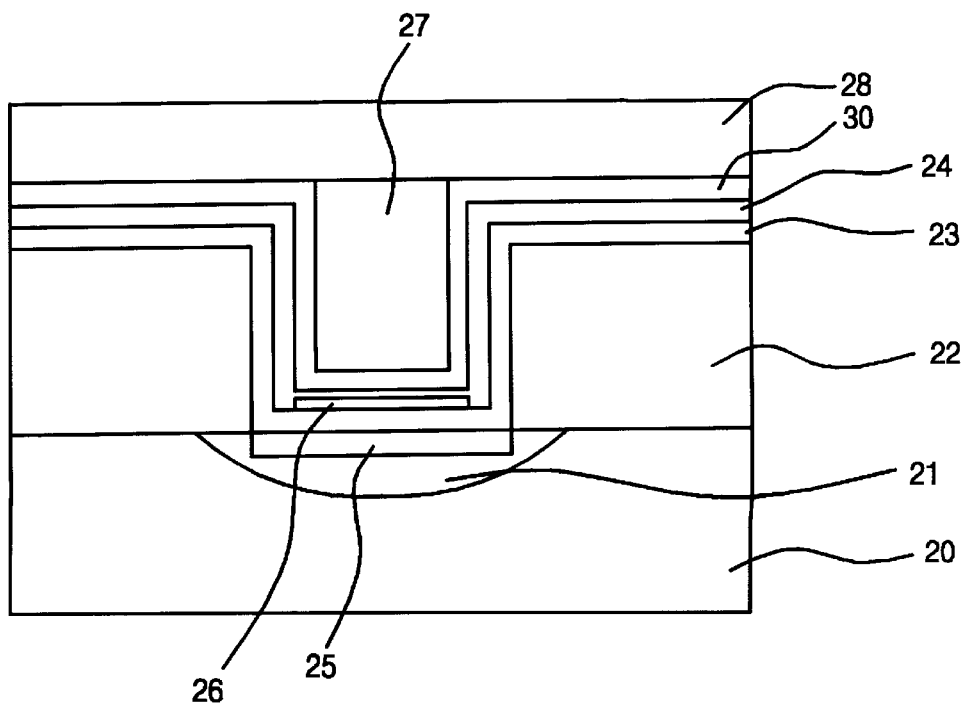

Referring to FIGS. 2D, a tungsten layer about 4000 Å thick is formed by CVD on the barrier metal layer 24 to fill up the contact hole.

Then, a tungsten plug 27 filling up the contact hole is formed by planarizing the tungsten layer by etchback or CMP until the surface of the barrier metal layer 24 is exposed.

Another tungsten layer about 1000 Å thick is deposited on the barrier metal layer 24 including a surface of the exposed plug 27 by CVD or sputtering.

Then, a bitline 28 is defined by patterning the tungsten layer on the barrier metal layer 24 by photolithography.

Accordingly, the present invention has the following merits when a DRAM of a COB(Capacitor Over Bitline) structure is fabricated.

Contact resistance and junction leakage are greatly reduced by sufficiently preventing boron atoms in a contact area from being diffused into a tungsten plug during a thermal process at a high temperature after the formation of a bitline.

And, an additional step of implanting ions after the formation of a contact hole is not required as the exact dose of ion-implantation for forming an impurity diffusion region is used and the outdiffusion of boron ions is prevented.

Moreover, mass-production and reliance of a device are improved as a metal layer is formed by a sputtering method of a related art and the nitrogen ion-implantation is carried out by a method of a related art.

It will be apparent to those skilled in the art that various modifications and variations can be made in a method of forming a contact in semiconductor device of the present invention without departing from the spirit or scope of the inventions. Thus, it is intended that the present invention cover the modifications and variations of this invention provided they come within the scope of the appended claims and equivalents.

What is claimed is:

1. A method of forming a contact in a semiconductor device, comprising the steps of:

forming an insulating layer on a semiconductor substrate wherein an impurity diffusion region is formed on a predetermined portion of the substrate;

forming a contact hole exposing a portion of the impurity diffusion region by removing a predetermined portion of the insulating layer;

forming a first conductive layer on the insulating layer and in the contact hole;

forming a second conductive layer on the first conductive layer;

forming a third conductive layer at an interface between the first conductive layer and the impurity diffusion region;

forming a buried layer for preventing ion-diffusion inside the second conductive layer, wherein the buried layer is formed by ion implantation at an energy level of approximately 10 to 30 KeV, and at a dose of approximately 1E15 to 3E15 atoms/cm²;

forming a conductive plug filling up the contact hole on a predetermined portion of the second conductive layer; and forming a fourth conductive layer on the second conductive layer wherein the fourth conductive layer is electrically connected to an upper surface of the plug.

2. The method of forming a contact in semiconductor device according to claim 1, wherein the first conductive layer and the second conductive layers are formed with Ti and TiN, respectively.

3. The method of forming a contact in a semiconductor device according to claim 1, wherein the impurity is boron.

4. The method of forming a contact in a semiconductor device according to claim 1, wherein the third conductive layer is formed with silicide.

5. The method of forming a contact in a semiconductor device according to claim 1, wherein the plug is formed by using $WF_6$ as a source gas.

6. The method of forming a contact in a semiconductor device according to claim 1, wherein the fourth conductive layer is a bitline.

7. The method of forming a contact in a semiconductor device according to claim 1, wherein the buried layer for preventing ion-diffusion is formed with nitrogen ions.

8. The method of forming a contact in a semiconductor device according to claim 1, wherein the first conductive layer is approximately 100 Å thick, the second conductive layer is approximately 400 Å thick, and wherein the first and second conductive layers are formed by sputtering or chemical vapor deposition.

9. The method of forming a contact in a semiconductor device according to claim 1, wherein the plug and the fourth conductive layer are formed with the same substance simultaneously.

10. The method of forming a contact in a semiconductor device according to claim 1, the method further comprising the step of forming a fifth conductive layer on the second conductive layer with the same substance as the second conductive layer.

11. The method of forming a contact in a semiconductor device according to claim 10, wherein the fifth conductive layer is formed to be approximately 100 to 300 Å thick, and wherein the fifth conductive layer is formed on the second conductive layer by sputtering with TiN.

12. The method of forming a contact in a semiconductor device according to claim 10, wherein the fifth conductive layer is formed to be approximately 100 to 300 Å thick, and wherein the fifth conductive layer is formed by CVD with TiN using $TiC_4$ and $NH_3$ as source gases.

13. The method of forming a contact in a semiconductor device according to claim 10, wherein the fifth conductive layer is formed to be approximately 100 to 300 Å thick, and wherein the fifth conductive layer is formed with TiN by CVD using a organometallic substance as a source material.

14. The method of forming a contact in a semiconductor device according to claim 1, wherein the first conductive layer is formed with Ti and the second conductive layer is formed with TiN by CVD using $TiCl_4$ and $NH_3$ as source gases.

15. The method of forming a contact in a semiconductor device according to claim 14, wherein the third conductive layer is formed spontaneously by forming the first and second conductive layers at a high temperature.

16. A method of forming a contact in a semiconductor device, comprising the steps of:

forming an insulating layer on a semiconductor substrate wherein an impurity diffusion region is formed on a predetermined portion of the substrate;

forming a contact hole exposing a portion of the impurity diffusion region by removing a predetermined portion of the insulating layer;

forming a first conductive layer on the insulating layer and an exposed surface of the contact hole;

forming a second conductive layer covering the first conductive layer and a third conductive layer at an interface between the first conductive layer and the impurity diffusion region simultaneously;

forming a buried layer for preventing ion-diffusion inside the second conductive layer, wherein the buried layer is formed by ion implantation at an energy level of approximately 10 to 30 KeV, and at a dose of approximately 1EB5 to 3E15 atoms/cm$^2$;

forming a conductive plug filling up the contact hole; and forming a fourth conductive layer on the second conductive layer wherein the fourth conductive layer is electrically connected to an upper surface of the plug.

17. The method of forming a contact in a semiconductor device according to claim 16, wherein the third conductive layer comprises silicide that is formed spontaneously by forming the second conductive layer at a high temperature.

18. The method of forming a contact in a semiconductor device according to claim 17, wherein the high temperature is over 600° C.

19. The method of forming a contact in a semiconductor device according to claim 16, wherein the first to fourth conductive layers are formed with Ti, TiN, silicide and W, respectively, and the plug is formed with W.

20. The method of forming a contact in a semiconductor device according to claim 16, wherein the fourth conductive layer is a bitline.

21. The method of forming a contact in a semiconductor device according to claim 16, the method further comprising the step of forming a fifth conductive layer on the second conductive layer with the same substance as the second conductive layer.

* * * * *